(12) United States Patent
Espino

(10) Patent No.: US 11,620,420 B2
(45) Date of Patent: Apr. 4, 2023

(54) COMPUTING SYSTEM SIMULATION AND TESTING ENVIRONMENT

(71) Applicant: Microsoft Technology Licensing, LLC, Redmond, WA (US)

(72) Inventor: Mayel Espino, Morgan Hill, CA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 959 days.

(21) Appl. No.: 16/212,202

(22) Filed: Dec. 6, 2018

(65) Prior Publication Data
US 2020/0184026 A1    Jun. 11, 2020

(51) Int. Cl.
| | |
|---|---|
| *G06F 16/90* | (2019.01) |
| *G06F 30/20* | (2020.01) |
| *G06F 16/901* | (2019.01) |
| *G06F 11/34* | (2006.01) |
| *G06F 11/30* | (2006.01) |
| *G06Q 10/0631* | (2023.01) |

(52) U.S. Cl.
CPC .......... *G06F 30/20* (2020.01); *G06F 11/3013* (2013.01); *G06F 11/3457* (2013.01); *G06F 16/9024* (2019.01); *G06Q 10/06313* (2013.01)

(58) Field of Classification Search
None
See application file for complete search history.

(56) References Cited

U.S. PATENT DOCUMENTS 5,796,951 A * 8/1998 Hamner .............. H04L 41/0233
709/223
2017/0004430 A1* 1/2017 Auradkar ......... G06Q 10/06375

* cited by examiner

*Primary Examiner* — Craig C Dorais
(74) *Attorney, Agent, or Firm* — Weaver IP L.L.C.

(57) ABSTRACT

Methods, systems and computer program products are described herein that enable executing simulation scenarios against a computing system simulation model to determine one or more appropriate modifications to a physical, operating computing system. The simulation model includes virtual components corresponding to a plurality of computing system components of the computing system. The virtual components of the simulation model are included in a graph database, and the virtual components correspond to one or more nodes and edges stored as a graph in the graph database. Execution of the simulation scenario produces a simulation result that is analyzed to determine at least one modification of the computing system, and where thereafter, the computing system is modified at least according to the determined modification. Embodiments also enable testing a physical computing system to determine whether the simulation model of the computing system is accurate, and/or to determine one or more computing system modifications.

20 Claims, 7 Drawing Sheets

200

| Node Type 202 | Node Definition 204 | Node Properties 206 |
|---|---|---|
| Producer 208 | Any entity that originates data to be persisted. | Name Type |
| Consumer 210 | Any entity that reads data and takes some action based on that data. | Name Type |
| Database 212 | A set of related tables. | Name Type IsCanonical |
| Table 214 | A set of related rows. | Name Type RowCount IsCanonical IsDeprecated |
| Field 216 | A particular column of data in a row. | Name Type EmptyCount IsCanonical IsDeprecated |
| Person 218 | An individual person (may be part of a Team) | Name Type/Title |
| Team 220 | A group of people that produces or consumes data, or both. | Name Type |
| Owner 222 | An entity that controls the use of the data. May be, e.g., a Team or Actor. | Name Type |
| Process 224 | A process may be a software program, but also may be a manual process. | Name Type |
| Scenario 226 | A specific situation we want to simulate and study. | Name Code Steps |
| Computing Component 228 | A computing component may be any personal computer, server, network component, or other hardware asset of the computing system. | Name Type IP Address |
| System 220 | A system is an interrelated collection of processes 226 and computing components 228. | Name Type |
| Datacenter 222 | A physical datacenter. | Name Type (category) |

FIG. 2

| Edge Type 302 | Edge Definition 304 | Edge Properties 306 |
|---|---|---|
| Produces 308 | This edge may go from a Producer 208 node to, e.g., a Table 214 or a Field 216 node. | Name Type Function |
| Consumes 310 | This edge may go from a Consumer 210 node to, e.g., a Table 214 or a Field 216 node. | Name Type |
| ContainsTable 312 | This edge may go from a Database 212 node to a Table 214 node. | Name |
| ContainsField 314 | This edge may go from a Table 214 node to a Field 216 node. | Name |
| Owns 316 | This edge may go from Owner 222 node to any other entity. | Name Type |
| LookUp 318 | This edge may go from a Table 214 node or a Field node 216 to, e.g., a Person 218, Process 224 or System 220. | Name |
| SendsSignal 320 | This edge may go from:, e.g., a Process 224, a System 220, Person, or Scenario, to:, e.g., a Process 224, a System 220, or an actor. | Name Type |
| Has 322 | This edge may go from any entity that "has" or includes some other entity. e.g. from a Computing Component 228 (e.g. a Server machine) to: a Process 224 (e.g. an instance of SQL Server) and indicates that the source node "has" or "includes" the destination node. | |
| DataFlow 324 | This edge may go between, e.g., Fields 216 showing either unidirectional or bidirectional data flow (e.g. change in one Field 216 propagating to another Field 216). | Type |

502 Providing a computer-readable memory device containing a simulation model of a computing system comprising a plurality of computing system components, the computing system components including a plurality of interconnected computing devices, the simulation model including virtual components comprising types and relationships between types

504 Obtaining a simulation scenario comprising a plurality of simulation steps, each step related to a state of a virtual component included in the simulation model

506 Executing the simulation scenario against the simulation model to produce a simulation result

508 Analyzing the simulation result to determine at least one computing system modification

510 Modifying the computing system according to the determined at least one system modification

602 Mapping one or more properties of each of a plurality of computing system components included in a computing system to one or more properties of a corresponding plurality of virtual components included in a simulation model.

604 Executing a simulation scenario against the simulation model to produce a simulation result, the simulation scenario comprising a plurality of simulation steps, each step related to a state of a virtual component included in the simulation model.

606 Applying a state change to at least one of the plurality of computing system components, the state change corresponding to a simulation step of the simulation scenario.

608 Monitoring a state of at least one of the plurality of computing system components to determine a test result.

610 Determining at least one modification to the computing system based at least in part on the simulation result or the test result.

FIG. 6

COMPUTING SYSTEM SIMULATION AND TESTING ENVIRONMENT

BACKGROUND

Modern enterprise computing systems are rarely, if ever, monolithic or fully integrated computing systems designed and built at once. Instead, modern enterprise computing systems often are built over time as the needs of a company scale and change. Accordingly, an enterprise computing system may comprise disparate systems and data sources with incomplete or non-existent knowledge of one another, or similarly lacking abilities to adequately communicate with one another. In such instances, it may be difficult to properly evaluate the computing system to identify redundancies or inefficiencies, or to understand how the computing system would behave under various hypothetical scenarios.

Operation of a cloud computing services platform such as, e.g., Microsoft® Azure®, requires significant fleet resources to maintain the availability and scalability that customers expect. For example, cloud computing services platforms require substantial hardware resources in the form of memory modules, hard drives, CPUs, server systems, etc. In such circumstances, enterprise resource planning ("ERP") or product lifecycle management ("PLM") systems may be employed to assist with tracking such hardware resources from procurement through retirement. Typically, however, ERP and/or PLM systems deployed by an enterprise may only partially track or reflect the state of fleet inventory since other, legacy systems and databases may exist with which it may be difficult for the ERP and/or PLM system to interoperate. The problem can become particularly acute where an enterprise includes organizations that were formerly entirely different companies, and each such company had its own information technology ("IT") infrastructure and processes.

As a result, it may be difficult for an enterprise to answer certain critical operational questions such as, for example, "What happens when there is a recall on a particular memory module?" It may be the case, for example, that the enterprise has an adequate supply of alternative, compatible, memory modules on hand resulting in no degradation or loss of services. On the other hand, it could also be the case that unless a suitable substitute can be sourced and procured, that valuable resources could be rendered inoperable. It may likewise be the case that such potentially inoperable resources are in a mission critical execution path for one or more computing system functions and, as such, additional redundancy ought to be incorporated into the system. However, the uncoordinated operation of numerous computing system components, applications, data sources and human resources may make it difficult or impossible to identify and prophylactically address computing system operational scenarios and system performance problems.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods, systems and computer program products are described herein that enable executing simulation scenarios against a computing system simulation model to determine one or more appropriate modifications to a physical, operating computing system. The simulation model includes a plurality of virtual components corresponding to a plurality of computing system components of the computing system. The virtual components of the simulation model are included in a graph database, and the virtual components correspond to one or more nodes and edges stored as a graph in the graph database. Execution of the simulation scenario produces a simulation result that is analyzed to determine at least one modification of the computing system, and where thereafter, the computing system is modified at least according to the determined modification.

Embodiments also enable testing a production computing system to determine whether the simulation model of the computing system is accurate, and/or to determine one or more computing system modifications. Such testing may be performed by applying a state change to at least one of the computing system components or associated data sources. Thereafter, the state of the production computing system may be monitored to (a) determine whether the resulting system state(s) are consistent with prior simulation results, and/or (b) determine one or more computing system modifications.

In embodiments, simulation scenarios may include computing system failure mode scenarios, computing system inventory management scenarios, computing system data flow scenarios and/or computing system component failure scenarios. In embodiments, computing system modifications may comprise physical modification to one or more computing system components, reconfiguring operating settings of one or more computing system components, modifying inventory procedures of the computing system, or configuring the computing system to generate notifications in response to one or more detected computing system states.

Further features and advantages of the invention, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments of the present application and, together with the description, further serve to explain the principles of the embodiments and to enable a person skilled in the pertinent art to make and use the embodiments.

FIG. 2 is a table of example simulation model nodes, according to an example embodiment.

FIG. 3 depicts a table of example simulation model edges, according to an example embodiment.

FIG. 5 depicts a flowchart of a method for executing simulation scenarios against a computing system simulation model to determine a computing system modification, according to an embodiment.

FIG. 6 depicts a flowchart of a method for executing simulation scenarios and field exercises against a computing system simulation model, and a computing system, respectively, according to an embodiment.

Figure 1:
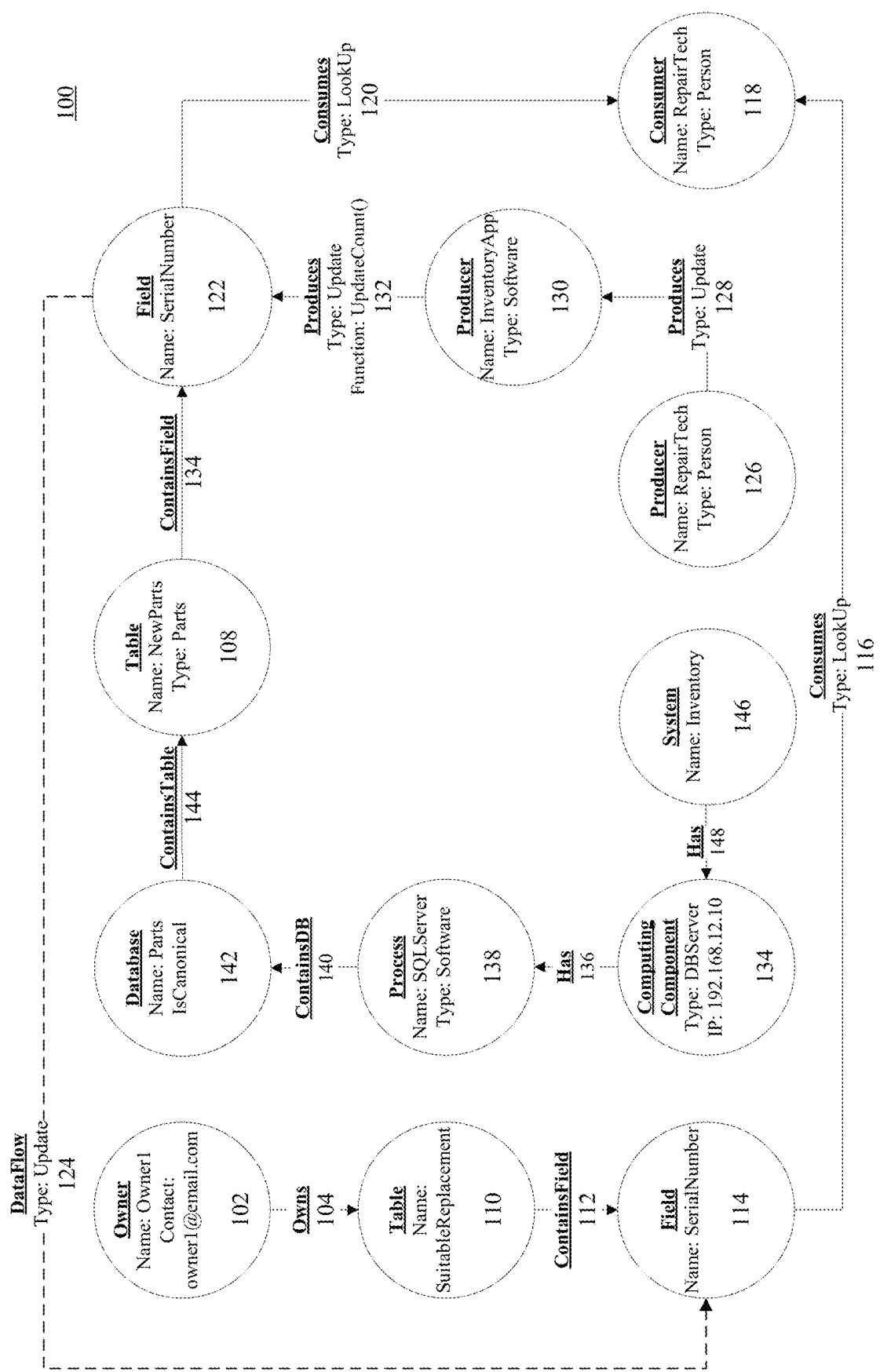
FIG. 1 depicts an example graph of a portion of a computing system including inventory tracking capabilities, and modeled according to an example schema, according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose one or more embodiments that incorporate the features of the present invention. The scope of the present invention is not limited to the disclosed embodiments. The disclosed embodiments merely exemplify the present invention, and modified versions of the disclosed embodiments are also encompassed by the present invention. Embodiments of the present invention are defined by the claims appended hereto.

References in the specification to "one embodiment," "an embodiment" "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a feature, structure, or characteristic is described in connection with an embodiment, it is submitted that it is within the knowledge of one skilled in the art to effect such feature, structure, or characteristic in connection with other embodiments whether or not explicitly described.

Numerous exemplary embodiments of the present invention are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Embodiments

Embodiments are enabled to simulate and test a computing system using a simulation model of the computing system. The simulation model embodies a logical mapping of computing system components included in the computing system, to virtual components of the model. Computing system components may comprise virtually any type of physical or virtual computing system component. Computing system components may comprise, but are not limited to: computer services, computer servers, rack of computer servers, datacenters including racks of computer servers, client computing devices, virtual machines, network infrastructure components, storage components, software components, electrical system components, building mechanical components, heating, venting and air conditioning components, lighting components, security system components, or system monitoring components.

The simulation model, on the other hand, includes virtual components that reflect the data sources, attributes, processes and virtual and physical components that comprise the computing system being modeled. In embodiments, the simulation model may be embodied by a graph stored in a graph database using a suitably designed computing system schema. Instead of the traditional columns and rows of a relational database table, graph databases store data in form of nodes and edges. A node may represent, for example, a distinct data value or set of related values, and edges connect the nodes and thereby represent relationships therebetween. Edges may likewise have one or more related values (e.g., a duration of the relationship embodied by the edge). For example, data related to company employees may be represented by a node for each employee, and edges may connect employees that work with one another thereby representing the relationship of "co-workers." In another example, an edge connecting a buyer and product may represent a product purchase, and may have attributes such as sale price, quantity, date, etc. A complete picture of all the nodes with all interconnecting edges is referred to as a graph.

Storing information in the form of a graph (as opposed to a native relational database table) and performing graph queries can be desirable where a business application or its underlying data involve complex many-to-many relationships, or anytime there is a need to analyze the relationships that underlie the data (i.e., where the relationships between data points matter as much or more than the data points themselves). In these situations, graph storage and query capabilities can be useful since a graph database system typically allows one to more easily express certain types of queries. Use of a graph database also lends itself to progressive changes to the schema. Relational databases, on the other hand, require a rigid and well-defined schema from the outset, and subsequent changes to the schema are difficult or impossible.

As discussed above, the simulation model of the computing system is embodied by a graph stored in a graph database. The graph is comprised of nodes and edges. There are many types of nodes, and each may include or be associated with data or metadata. In embodiments, the edges represent the relationship between nodes, and typically are represented in a graph as a unidirectional arrow (though may also be bi-direction in embodiments). Multiple edges may be between different nodes where, for example, there are multiple relationships to represent. For example, FIG. 1 depicts an example graph 100 of a computing system modeled according to an example simulation model nodes and edges as depicted in tables 200 and 300 of FIGS. 2 and 3, respectively. Table 200 of FIG. 2 illustrates an example node schema, according to embodiments. Table 200 includes three columns: node type 202, node definition 204 and node properties 206. Each of the listed node types 202 will now be discussed in turn in conjunction with corresponding node definitions 204 and node properties 206 for each node type. It should be noted, however, that the node types 202, node definitions 204 and node properties 206 as shown in table 200, and edge types 302, edge definitions 304 and edge properties 306 as shown in table 300 are merely exemplary, and do not constitute an exhaustive list of node types, node definitions, node properties, edge types, edge definitions, or edge properties for all embodiments. Instead, tables 200 and 300 constitute only one possible graph schema that may be employed in embodiments. It will of course be understood by those skilled in the art that other schemas may be employed without departing from the spirit and scope of invention as claimed.

Table 200 of FIG. 2 includes a Producer 208 node type. In embodiments, an instance of Producer 208 includes any entity that originates data that is to be persisted or stored. Producers 208 can represent virtually any type of entity including processes, software, humans, teams and so forth, so long as the entity produces data. Node properties 206 that may be associated with Producers 208 include, for example, Name and Type. Example of such properties will be discussed in further detail herein below. Embodiments may also include instances of a Consumer 210 node type that, in contrast to Producers 208, read data or takes some action based on that data. Consumers 210 may likewise include Name and Type node properties, in embodiments. A Name node property, as the its name implies, serves as a human-readable textual identifier for an instance of the given node. In other embodiments, however, the name may be any type of identifier including alphanumeric identifiers including numerals and letters, or numeric identifiers in decimal, hexadecimal, or any other suitable number base. The Type node property includes metadata that identifies a type associated with an instance of the given node. For example, and recalling that a Consumer 210 node type comprises any entity that reads data and/or takes some action based on the data, the Type node property associated with an instance of a Consumer 210 node type may be a person, a team comprised of multiple people, a software application, a database system, or virtually any other data consumer, in embodiments.

Embodiments may also instantiate one or more of these related node types: Database 212, Table 214, and/or Field 216. Node types 212-216 correspond to data stored in traditional relational databases, tables and fields of tables. As such, Database 212, for example, may comprise a set of related tables, in embodiments. Likewise, a Table 214 includes a set of related rows or fields, in embodiments. Finally, a Field 216 corresponds to a particular column of data in a row.

Instances of node Database 212 may include a number of different node properties 206. Such properties may comprise, for example, Name and Type as will be discussed below. A Database 212 may also include an IsCanonical node property, in embodiments. The IsCanonical node property may be used when multiple data sources include some or all of the same data due to replication or other mechanisms that cause multiple copies of data to exist in a computing system. In practice, IsCanonical is a flag that when set signifies that the corresponding data source is authoritative, and should be relied upon to resolve any inconsistencies that may exist between data sources.

In embodiments, instances of node Table 214 may include a number of node properties. Such properties may include, for example, Name, Type, IsCanonical, RowCount and IsDeprecated, in one or more embodiments. In embodiments, the Name, Type, and IsCanonical node properties match those as described immediately above. The RowCount node property, as its name implies, represents the number of rows in the Table 214 instance. Such information may be useful, for example, in making cardinality estimates for an instance of Table 214. The IsDeprecated node property may flag when a given data table or portions thereof are deprecated in favor of another data source.

In embodiments, instances of node Field 216 may include node properties virtually identical to those of Table 214, except instead of RowCount, Field 216 may include node property EmptyCount. EmptyCount, like RowCount, may be useful for making cardinality estimates with respect to an instance of Table 214 and or Fields 216 included therein.

Embodiments may also instantiate the related node types Person 218, Team 220, and Owner 222. A Person 218, as its type name implies, represents an individual person. A Team 220, represents a group of Persons 218 that may, for example, produce or consume data, or both. It should be understood, however, that producing and/or consuming data are not the only criteria for defining a Team 220, and Team 220 may have other node definition criteria in other embodiments. In an embodiment, an Owner 222, may comprise a Person 218, a Team 220, or any other entity that owns or controls data, metadata, processes, software applications, or any other type of computing system component included in the simulation model. Instances of each of Person 218, Team 220, and Owner 222 may include node properties such as, for example, Name, Type and/or Type/Title, in an embodiment. In embodiments, node properties Name and Type/Title may conform to the property definitions to for each properties as discussed above.

Node types 202 may also include Process 224, and/or Scenario 226. In embodiments, a Process 24 may be any type of multistep process including software programs, computer scripts, macros, and/or other types of processes including automated, manual, or combined automated and manual processes that may be well defined within the schema in use. As will be discussed in more detail below. Scenario 226 comprises a set of steps, code, queries and the like, that may be used as to execute a simulation against the simulation model, in embodiments.

Embodiments may also instantiate the following related node types: Computing Component 228, System 230, and Datacenter 232. Computing Component 228 may represent virtually any type of computing component, including a personal computer, a server, a network component, or any other hardware asset integrated into the computing system. In addition to Name and Type node properties, Computing Component 228 may also include, for example an IP address. Node System 230 is generally defined as a collection of interrelated Processes 226 and Computing Components 220. Node Datacenter 232 generally represents a physical datacenter. A physical data center will of course include various types of processes and computing components, and accordingly, Datacenter 232 may include or refer to instances of Computing Component 228 or System 230, or both.

As discussed or may be inferred by the description of node types 202 of table 200 immediately above, various relationships between different instances of nodes naturally exist. For example, instances of Database 212 will ordinarily contain or include instances of Tables 214. Certain of the relationships between nodes may in theory and in practice be reflected by one or more node properties included in instances of such notes. In a graph database, however, relationships between nodes are most often and most usefully reflected in edges that connect such nodes. As will be discussed in further detail below, the interconnection of nodes by edges in a graph database enable very powerful queries and simulations to be performed against a simulation model embodied by a graph stored in the graph database. As with node types, a useful graph schema must therefore include edge types including a corresponding edge definitions and edge properties. For example, table 300 of FIG. 3 depicts a table including an edge schema including definitions and properties, according to an example embodiment. Other edge schema embodiments will be apparent to persons skilled in the relevant art(s) based on the following discussion regarding table 300 of FIG. 3.

Table 300 of FIG. 3 illustrates an example edge schema, according to embodiments. Table 300 includes three columns: edge type 302, edge definition 304 and edge properties 306. Each of the listed edge types through 2 will now be discussed in turn in conjunction with corresponding edge definitions 304 and edge properties 306 for each edge type.

Table 300 of FIG. 3 includes edge types 302 as follows: Produces 308, Consumes 310, ContainsTable 312, ContainsField 314, Owns 316, LookUp 318, SendsSignal 320, Has 322, and DataFlow 324. In an embodiment, edge type Produces 308 comprises an edge going from a Producer 208 node, to some other node such as for example Table 214, or Field 216. Edge properties 306 of table 300 corresponding to node Producer 308 include Name, Type, and Function. The Name edge property is as described above in conjunction with the Name node property. The Type edge property associated with edge Produces 308 may serve to identify the mode by which the associated Producer node 208 is producing the data directed to the target of edge Produces 308. For example, producer node 208 may operate to update data that already exists, or to originate data in the first instance. For example, Producer 208 may generate entirely new rows to be added to an existing Table 214 in a Database 212, in embodiments. Likewise, the metadata associated with the function edge property of an instance of edge Produces 308 may further define more specifically how node Producer 208 operates in conjunction with corresponding edge Produces 308. For example, in embodiments, where an instance of edge Produces 308 has an edge property Type equal to "Update", the Function edge property may specify what it is that is being updated. Edge Consumes 310 Type property is analogous to that of edge Produces 308, except running from an instance of node Consumer 210 to, for example, a Table 214 or Field 216 node.

Embodiments may also instantiate edges ContainsTable 312 or ContainsField 314. In an embodiment, an instance of edge ContainsTable 312 typically runs between node Database 212, and node Table 214. Likewise, edges such as ContainsField 314 typically are directed from a Table 214 to a Field 216, in embodiments. In an embodiment, edge Owns 316 runs from node type Owner 222, to any other entity and denotes the ownership relationship between node Owner 222 and whatever the edge Owns 316 is pointing towards.

Additional edge types that may be instantiated by embodiments include LookUp 318, SendsSignal 320, Has 322 and DataFlow 324. In embodiments, edge LookUp 318 may be directed between a Table 214 node or a Field 216 node to, e.g., a Person 218 node, a Process 224 node or a System 220 node. Edge LookUp 318 signifies that the source node is looking up or retrieving some data from the target node. Similarly, the SendsSignal 320 edge may go from, e.g., a Process 224, a System 220, a Person 218, or a Scenario 226, to, e.g., a Process 224, a System 220, or a Person 218. Indeed, edge SendsSignal 320 may connect any nodes that send some type of signal from one node to the other node.

Edge Has 322 signifies that the destination node "has" or "includes" the source node. For example, edge Has 322 may go from node Datacenter 222 to: node System 220, node Process 224, node Team 220, or indeed, any node that corresponds to something physically or logically "included" in the datacenter associated with the instance of node Datacenter 222.

Finally, edge DataFlow 324 may go between any entities that experience a flow of data between them. For example, suppose two instances of a node Field 216 include the same data, and that a change in one such Field 216 causes the other instance of Field 216 to be updated. In such a case, edge DataFlow 324 may show the unidirectional or bidirectional data flow between the fields.

The schema embodied by the node and edge types depicted in tables 200 and 300, respectively, and as described above, may be used in various ways to model and described computing systems and related processes. For example, FIG. 1 depicts an example graph 100 of a computing system modeled according to an example schema, according to an embodiment. FIG. 1 is described with continued reference to FIGS. 2 and 3. However, other structural and operational embodiments will be apparent to persons skilled in the relevant art(s) based on the following discussion regarding graph 100 and tables 200 and 300 of FIGS. 2 and 3, respectively.

Graph 100 of FIG. 1 includes several nodes and interconnecting edges, and depicts an example graph of a portion of a computing system including inventory tracking capabilities, and modeled according to an example schema, according to an embodiment. In embodiments, the inventory tracking capabilities may be used by, for example, a Repair Technician. Graph 100 includes the following nodes: Owner 102, Tables 108 and 110, Fields 114 and 122, Producers 126 and 130, Consumer 118, Computing Component 134, System 146, Process 138 and Database 142. Each of these nodes includes a Name property. Owner 102 also includes a Contact property with the owner's contact information. Producer nodes 126 and 130, Computing Component 134 and Process 138 each also include Type properties. Producer 126 is of Type "Person", and Producer 130 and Process 138 are of type "Software." Computing Component 134 is of type "DBServer" indicating that the component is a server for running database applications. Finally, Consumer 118 is also of Type "Person." Note, Producer 126 and Consumer 118 share a common name: RepairTech.

Graph 100 includes the following edges: Owns 104, ContainsField 112 and 134, Produces 128 and 132, Consumes 116 and 120, DataFlow 124, Has 136 and 148, ContainsDB 140 and ContainsTable 144. Both instances of Produces edges 128 and 132 includes an edge property Type equal to "Update." Likewise, both instances of Consumes edges 116 and 120 includes an edge property Type equal to "LookUp". Each of these nodes and edges, and the relationships therebetween will now be discussed.

As discussed above, an edge generally reflects the relationship between the nodes that are connected by the edge. For example, edge Owns 104 is a directed edge that runs from node Owner 102 and node Table 110. Edge Owns 104 thereby signifies that Table 110 is owned by Owner 102. In embodiments, Table 110 may also be contained in a Database running on a server or other computing component. For example, consider Table 108 which is analogous to Table 110. Table 108 is contained by Database 142 named "Parts." Tracing backwards from Database 142, it can be appreciated that Database 142 is contained by Process 138 (i.e. an instance of software SQL Server) which is running on Computing Component 134 as reflected by edge Has 136. Further, Computing Component 134 is part of System 146 as denoted by edge Has 148 directed from System 146 to Computing Component 134. In practice, a complex computing system will include a number of different components, processes, etc., referred to by a System node like System 146. For the sake of brevity and space, however, not all physical Computing Component nodes are illustrated in graph 100 of FIG. 1. Therefore, for example, graph 100 of FIG. 1 does not include the Database that contains Table 110, nor the Process or Computing Component that contains such a Database.

Referring back to Fields 114 and 122, edges ContainsField 112 and 134 reflect the relationship between their corresponding nodes. For example, edge ContainsField 112 is directed from Table 110 to Field 114 and signifies that Table 110 "contains" or includes the data represented by node Field 114. Edge ContainsField 134 signifies the same relationship between its corresponding nodes.

Edges Consumes 116 and 120 are both directed to the entity that is consuming the data stored in the respective Fields associated with each edge. In particular, Consumer 118 is consuming Field 114 and 122. The Type edge property on each of Consumes 116 and 120 signify that Consumer 118 is consuming the data of Fields 114 and 122 via a LookUp.

The Produces edges 128 and 132 each include an edge property Type equal to "Update." These edges thereby signify that the respective source nodes (e.g. Producer 130) are propagating Updates to the destination nodes (e.g. Field 122). Note, edge Produces 128 is between two Producer nodes which may seem odd at first blush. However, this serves to illustrate that, in embodiments, a Producer node need not be persisting data to storage, but may instead be passing the produced data to some other node for intermediate or even final use without storage. Having described the nodes, edges and the relationships between each, discussion now turns to a general description of the operation of the computing system corresponding to the graph.

As mentioned above, graph 100 of FIG. 1 depicts a model of an inventory tracking computing system, and such computing system may operate as follows, in an embodiment. Suppose a repair technician "RepairTech" is making a repair to some piece of equipment (e.g. in a related, and interconnected cloud computing system). After diagnosing the problem with the hardware, the RepairTech needs to find a suitable replacement part. To accomplish this, the RepairTech may perform a lookup of part serial numbers in a table of suitable replacements. These actions and relationships are reflected by nodes Table 110 (containing SuitableReplacement data), Field 114 (containing the SerialNumbers of the SuitableReplacements), and Consumer 118 that is a consumer node of Type=Person, with the name RepairTech.

The RepairTech may also perform a lookup of SerialNumbers in Field 122 which correspond to NewParts as stored in Table 108. After procuring the replacement parts, the RepairTech may cause the inventory count of the procured parts to update (i.e. to decrement). These actions correspond to nodes Producer 126, Producer 130 and Field 122, and edges Produces 128 and Produces 132. The first Producer node 126 (i.e. the RepairTech) enters an update into the inventory application of Producer 130, which in turn causes an update to propagate to Field 122 via the UpdateCount( ) function of Produces 132.

Finally, because Field 122 and Field 114 (each containing serial numbers) may or may not correspond to the same physical storage, an edge DataFlow 124 may be included between Fields 122 and 114 where updates in, e.g., Field 122, should be propagated to Field 114. Recalling the definition of the IsCanonical node property discussed above, note that Database 142 includes that node property. Accordingly, data stored in Database 142 is regarded as authoritative, and changes to Field 122 contained therein may be propagated from Field 122 to Field 114, in an embodiment. Note, a DataFlow edge may indicate bi-directional dataflow as well, in which case the edge ordinarily will be rendered with arrows at both ends.

Having mapped a physical computing system onto a model such as that shown in FIG. 1, and including representations of its hardware components, processes, software and various actors/personnel, embodiments are enabled to perform various complex queries and simulations against the model in various ways. In embodiments, queries against the graph database, as well as simulations, may be enabled by a suitable graph traversal query and programming language such as, for example, the open-source Gremlin graph traversal and programming language released by the Apache Software Foundation.

For example, suppose Computing Component 134 of FIG. 1 is, as was discussed above, only one of many Computing Component nodes referenced by and included in System 146 (e.g., by a 'Has' edge). Supposing that we start with node System 146, and wish to know the name of every person that looks up the serial number of parts in any Table in System 146. Assuming the schema/topology of graph 100, a Gremlin query to answer this question may look like:

g.V(SystemNode146.out('Has').out('Has'),out('ContainsDB').

out('ContainsTable').has('Type', Parts').out(ContainsField).

hasLabel('SerialNumber').outE( ).has('Type', 'LookUp').

inV( ).values('Name')

When the above query is executed against graph 100, the output is the Name of node Consumer 118, i.e. 'RepairTech'.

Of course, more complex queries are possible, and additional programming aside from queries may be used to model the capabilities of a computing system. For example, consider the following graph schema where [nodes] are denoted with brackets and ---edges---> are denoted by directed arrows:

---

[auditing]--isCapable-->[Security]--tracks-->[ComputingComponent]--
  --isDefinedBy-->IPAddress<---defines | status:missing ---
ComputingComponentIPAddress

---

Such a graph schema map be employed to determine whether Computing Components in the system have an audit capability using pseudo-code as follows, and assuming the path traversal starts at a Root system node:

---

```
json_path[ ]=call_gremlin("g.v(Root.out(isCapable).out(tracks).
   out(isDefinedBy).in(defines).path( )")
Audit_Capability = traverse_path_and find_status(json_path):
   status = true
   foreach (path in json_path){
      foreach (node in path) {
         if node.status == "missing"
            status = false
         endif
      }
   }
   return status
```

---

The results of this evaluation may show one or more components for which the audit capacity is missing or disabled, and that may thereby create a potential security hole. The physical computing system corresponding to the model may thereafter be modified to close this hole. In embodiments, computing system modifications to remedy an issue identified by a simulation may include physically modifying or replacing at least one computing system component, removing at least one redundant computing system component, adding additional computing system components, reconfiguring operating settings of at least one computing system component, modifying inventory procedures of the computing system, or configuring the computing system to automatically generate a notification in response to a detected computing system state.

In this example, a notification email may be generated that provides an alert to appropriate security personnel that a possible audit trail issue exists with the computing component corresponding to the Computing Component node of the system graph, Embodiments may also usefully permit simulating computing system failure mode scenarios. For example, a simulation scenario may inject one or more hardware failures into the computing system model to evaluate how the remainder of the system functions under such conditions. By way of further example, executing a simulation against the model of a distributed cloud computing platform may permit discovery of bottlenecks and/or service failures that may arise due to a lack of sufficient compute and/or network resources in a given location or at a given time. Consider, for example, the graph 100 of FIG. 1 depicting a portion of a computing system including inventory tracking capabilities. As discussed above, updates to Field 122 ought to be propagated to Field 114 by virtue of Database 142 being marked as IsCanonical. A simulation scenario could test operation of the system with update edge DataFlow 124 removed or disabled to simulate a communication break or failure between the physical assets housing data of Field 122, and that house data of Field 114. In this scenario, it is possible that the repair technician represented by Consumer 118 could receive inconsistent data via Consumes 120 vs Consumes 116. Of course, various outcomes are possible in such a situation, and one of ordinary skill will appreciate the means by which this simulation scenario might be extended to determine additional systemwide impacts.

Where the above discussed scenario discovers potential computer system impacts of sufficient severity due to the broken link between Field 122 and Field 114, one or more system modifications may be identified and implemented to mitigate or eliminate these impacts. For example, redundant and geographically diverse communications links may be installed between Field 122 and Field 114 to ensure data consistency between each Field.

Cloud computing and other types of computing platforms are increasingly relied upon by enterprise to the degree that any down time can be very costly to the organization and/or to third-party customers that host enterprise applications on the cloud computing platform. It is increasingly important to be pro-active about system maintenance to minimize downtime. For example, cloud computing datacenters contain a huge number of server racks, servers and storage devices such as hard drives. Each server may include at least one CPU and usually multiple memory DIMMs. Datacenter component count for a large enterprise may quite easily exceed tens of millions. Supposing a datacenter or collection of datacenters comprises 10 million components (e.g. CPUs, memory DIMMs, hard drives, motherboards), and even at an annualized component failure rate of 1%, that equates to 100,000 failed components per year, or over 270 per day. Accordingly, the ability to predict component failures is in increasing demand. Embodiments may be configured to predict component failures to enable (a) sourcing replacement devices in time for them to be available at failure time and (b) pro-actively replacing parts that, although not completely failed, are statistically at end-of-life.

For example, consider the following schema describing nodes and edges that may be included in embodiments of the invention:

1. [sparesForecast]<--input--[total_number_Of_FRUs_bought]. property(forecast.for_each_record)<--defines--[quantity_field_in_purchacing_table]
2. [sparesForecast]<--input--[total_number_Of_FRUs_bought]<--searchBy--[model_field_in_purchacing_table]
3. [sparesForecast]<--input--[number_of_tickets_for_FRU_model]<--defines--[quantity_field_in_breakFix_table]
4. [sparesForecast]<--input--[number_of_tickets_for_FRU_model]<--searchBy--[model_field_in_breakFix_table]
5. [sparesForecast]<--input--[total_number_of_tickets_for_FRU_type]<--defines--[quantity_field_in_breakFix_table]
6. [sparesForecast].property(formula: "{number_Of_FRUs_bought}*({number_of_tickets_for_FRU_model_}/{total_number_of_tickets_for_FRU_type})")

Again recall that [nodes] are in brackets and that -edges--> are directed arrows. In the above illustrated schema an 'FRU' is a "field replaceable unit" such as, for example, a CPU, memory DIMM or hard drive. The schema above defines a [sparesForecast] formula (defined as a property of that node) based on the historical purchases for a given FRU model over some period of time, the total number of trouble tickets entered for that particular FRU model over the given period, and the total number of tickets entered for all FRUs of the same type (e.g. memory DIMMs) over that period. In this context, a "trouble ticket" any record of a failure requiring replacement of an FRU. Typically, a repair technician in the datacenter will troubleshoot a failed server to determine which, if any, components need to be replaced, and create a trouble ticket flagging the system and diagnosis. The ratio of number of tickets for a given FRU model (e.g. particular model of memory DIMM) to that of the total number of tickets for an FRU type (e.g. *all* models of memory DIMMs) represents a relative failure rate for that FRU model. That ratio multiplied by the total number of FRUs bought during the same time period represents a forecast or prediction of the number that may or ought to be purchased for the next equivalent time period.

After defining the above schema and its formula, the forecast needs to be determined for all FRUs in the system. The following pseudo-code simulation may generate a forecast report for all FRUs:

```
generateForecastReport(forecast_id){
    // Find the input with the valueAsIndex attribute
    valueAsIndexString = call_gremlin("g.v(forecast_id).in("input").value(valueAsIndex)")
    // Call SQL to get the array of records for the given field
    valueAsIndex = call_SQL_to_get_list_of_records(valueAsIndexString)
    foreach(record in valueAsIndex){
        formula=call_gremlin("g.v({forecast_id}).values(formula)")
        listOfInputs[ ]=get_list_inputs("g.v({forecast_id}).out(input)")
        foreach(input in listOfInputs) {
            sqlString = get_string_for_input(input){
                from = getFromStatement("g.v({input}).in(defines)")
```

```
        whereIndex = getFromStatement("g.v({input}).
            in(searchBy)")
        return from+whereIndex
    }
    // this variable will be named after what ever the input vertex is
    named. For example: number_Of_FRUS_bought
    {input} = call_SQL(sqlString)
    }
    // This function will substitute the input variables for their values
    forecast = convertStringToFormula(formula)
    // This function will call SQL to update/create a record in the
    {forecast}
    reports table
    update_forecast_report(cast, tableName)
    }
}
```

The above-discussed simulation scenario providing a component failure forecast or prediction may also be useful for simulating inventory shortfall scenarios. For example, the forecast report identifies the most failure prone components in the datacenter. In an embodiment, one or more such components may be marked as unavailable in the computer system model (i.e. in one or more database tables or fields) such that server systems cannot be repaired as they fail. Using the historical failure rates for such components, a simulation scenario may disable Computing Component nodes at the same rate and assess the system impacts in terms of latency, capacity, CPU loads and the like.

Embodiments also usefully enable analytics and reporting scenarios. For example, and similar to the FRU forecasting scenario described just above, embodiments may track metrics for FRUs over time, and provide reports related to same. In particular, suppose ten memory DIMMs are received at assembly (where datacenter servers are constructed in the first instance). Embodiments may implement tracking scenarios to track each DIMM across its lifecycle, including use statistics (e.g. hours of operation) and related environmental data (e.g. min/max/average temperature). Collection of such statistics and data by analytics scenarios enable later generation of reports that detail, for example, any correlation between temperature statistics and CPU/DIMM/hard drive failure rates. Note, temperature statistics and related reports are described herein by way of example only, and embodiments may employ scenarios that track and report on virtually any types of data associated with the computing system.

In another related embodiment, a simulation scenario may traverse the graph model to determine redundant data sources and/or cross reference such data sources with one another. For example, multiple sources for a particular computing system component may be available within an organization, and embodiments may generate a cross reference of part numbers and generate recommendations for part substitutions based on performance or supply problems.

Of course, models of a complex computing system, and simulation scenarios run against such models are not without their limitations. For example, although the simulation model may be capable of setting, getting and monitoring a large number of different states for different virtual components included in the model, such a model will not of course be exhaustive in its emulation of a physical system. Accordingly, certain failure modes may be difficult to predict, or even where they can be predicted, it may be difficult to accurately simulate the effects that such failure modes have on the system as a whole. Accordingly, embodiments may also be configured to execute one or more scenarios against a live production computing system. That is, instead of altering the state of a virtual component in the simulation model and determining how the system reacts, embodiments may alter the actual physical and/or operating state of the production system being modeled. For example, a network resilience scenario may be run against the production system to test system effects of, for example, an outage of one or more communication paths, or a distributed denial of service ("DDoS") attack. Particularly with the DDoS scenario, it may be difficult to model and simulate the effects such an attack may have on the system due in part to scale. Executing the scenario against a production system may provide useful information about how the system reacts, the efficacy of any third-party DDoS mitigation service the computing system may rely upon and the accuracy of the simulation model itself Such information may be used to determine one or more computing system modifications as discussed above, and may likewise be used to determine one or more simulation model modifications (i.e. to make the model more accurate in simulating a real-world scenario).

Figure 4:
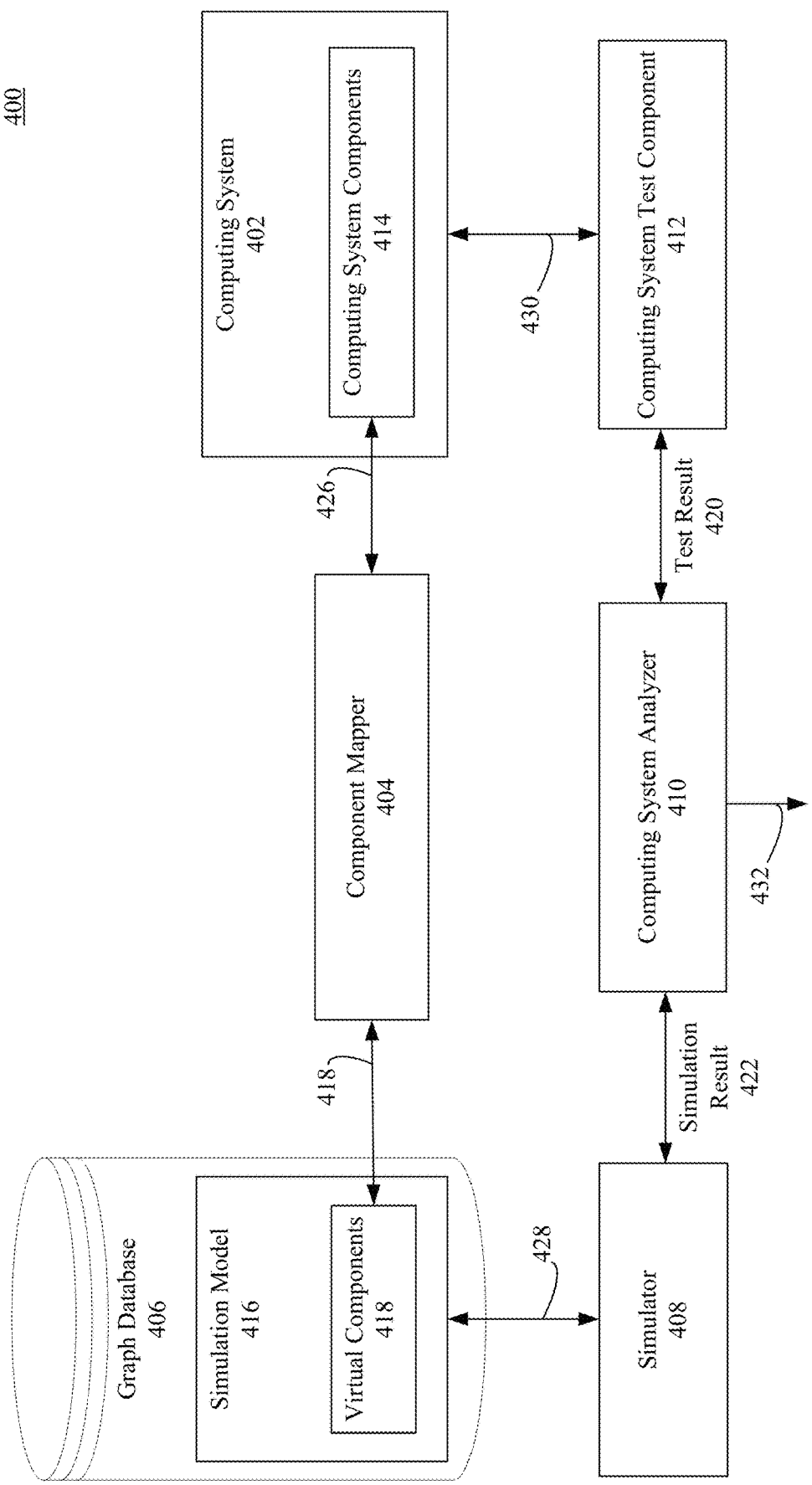
FIG. 4 is a block diagram of an example computing system simulation and testing environment, according to an example embodiment.

Embodiments may simulate and test computing systems in the above-discussed fashion, and may do so in various ways. For example, FIG. 4 shows a block diagram of a computing system simulation and testing environment 400, according to an example embodiment. Other structural and operational embodiments will be apparent to persons killed in the relevant art(s) based on the following discussion regarding computing system simulation and testing environment 400.

Computing system simulation and testing environment 400 includes computing system 402, component mapper 404, graph database 406, simulator 408, computing system analyzer 410 and computing system test component 412. Computing system 402 includes computing system components 414. Graph database 406 stores simulation model 416 comprised of virtual components 418. Environment 400 is described in further detail as follows.

Computing system 402 is comprised of computing system components 414, according to an embodiment. Computing system components 414 may include one or more server devices and/or other computing devices. More specifically, computing system components 414 may include one or more computer services, computer servers, rack of computer servers, datacenters including racks of computer servers, client computing devices, virtual machines, network infrastructure components, storage components, electrical system components, building mechanical components, heating, venting and air conditioning components, lighting components, security system components, system monitoring components, and other types of computing system components as known in the art. In embodiments, computing system components 414 may be coupled together and interoperate via one or more networks (not shown), one or more peer-to-peer connections, or a combination of network and peer-to-peer connections. Example networks may comprise, for example, local area networks (LANs), wide area networks (WANs), enterprise networks, and may include one or more of wired and/or wireless portions. Example peer-to-peer connections may also include one or more wired and/or wireless portions.

Environment 400 also includes component mapper 404. In embodiments, component mapper 404 may be configured to programmatically map data 426 accepted or obtained from computing system 402 to virtual components 418 of simulation model 416. For example, as discussed above, a computing system component 414 such as, for example, a database may be mapped onto a Database 212 node as defined in FIG. 2. Data 426 may include all the information required to perform the mapping between the physical computing system 402 and the virtual computing system embodied by virtual components 418. For example, suppose computing system 402 includes a database server in computing system components 414. Referring to Computing Component 134 of graph 100 of FIG. 1, it will be appreciated that data 426 necessary to define and instantiate Computing Component 134 must include the Type and IP Address of the server. Computing Component 134 designates a Type since of course other instances of Computing Component nodes may not be database servers. In embodiments, Computing Component 134 of FIG. 1, as well as other instances of Computing Component nodes, may be required to include additional properties depending on the nature of the particular simulation scenarios to be executed against the model.

It should likewise be noted that in various embodiments, data 426 may be programmatically gathered by component mapper 404 from computing system components 414 (e.g. by executing data ingestion tools that discover and ingest data from various types of databases in computing system components 414). In other embodiments, on the other hand, component mapper 404 may present a user interface for manual creation of virtual components 418. For example, when a new process, service or sub-system is added to computing system 402, it may be difficult for component mapper 404 to automatically discover and map the new computing system components. Accordingly, an embodiment may provide guided and/or semi-automated means of adding additional virtual components 418 to simulation model 416.

Finally, after receiving or obtaining data 426 required to generate corresponding virtual components 418, embodiments of component mapper 404 may create virtual components within simulation model 416 of graph database 406 by executing graph queries that create the corresponding nodes and edges, along with required properties of each, as appreciated by those skilled in the art.

Environment 400 also includes simulator 408. In embodiments, simulator 408 may be configured to accept scenario simulation code (e.g., such as the pseudo-code snippets discussed above) and execute the same against simulation model 416. The simulation result 422 is passed to computing system analyzer 410. For example, the forecast report generated by the component failure simulation discussed above may be provided to computing system analyzer 410 for further processing and/or analysis. In embodiments, computing system analyzer 410 of environment 400 may be configured to accept a simulation result 422 and, as discussed in detail above, determine one or more modifications 432 to computing system 402.

Environment 400 also includes computing system test component 412, and in embodiments, may be configured to inject one or more state changes into the operating computing system 402 to determine how the computing system 402 may react and/or function to various changes (e.g., network and/or computing capacity changes, as discussed in detail above). Computing system test component 412 is likewise configured to monitor the operation of one or more computing system components and/or the states of one or more processes operating in computing system 402. In so monitoring, computing system test component 412 may generate test result 420 that may be provided to computing system analyzer 410. As with simulation result 422, computing system analyzer 410 is configured to analyze test result 420 to determine one or more modifications 432 to make to computing system 402. In embodiments, computing system analyzer 410 may be further configured to compare simulation result 422 and test result 420 to determine if or how simulation model 416 may be improved to better predict real-world operation of computing system 402 in the face of stress inputs.

Embodiments of computing system simulation and testing environment 400 may perform simulations of, for example, computing system 402 in various ways. For example, FIG. 5 depicts a flowchart 500 of a method for executing simulation scenarios against a computing system simulation model to determine a computing system modification, according to an embodiment. In an embodiment, simulator 408 (in conjunction with simulation model 416 of graph database 406) and computing system analyzer 410 may perform the method of flowchart 500. FIG. 5 is described with continued reference to FIG. 4. However, other structural and operational embodiments will be apparent to persons skilled in the relevant art(s) based on the following discussion regarding flowchart 500 and environment 400 of FIG. 4.

As shown in FIG. 5, flowchart 500 begins at step 502. In step 502, a computer-readable memory device is provided, and contains a simulation model of a computing system comprising a plurality of computing system components, the computing system components including a plurality of interconnected computing devices, the simulation model including virtual components comprising types and relationships between types. For example, and with continued reference to FIG. 4, graph database 406 is provided, and contains simulation model 416 of computing system 402 that itself comprises a plurality of computing system components 414. As discussed in detail above, simulation model 416 includes virtual components 418 that correspond to the plurality of computing system components 414 of computing system 402, and the virtual components 418 are comprised of types (e.g. nodes) and relationships between types (e.g. edges).

In step 504, a simulation scenario is obtained, the simulation scenario comprising a plurality of simulation steps, each step related to a state of a virtual component included in the simulation model. For example, and with continued reference to FIG. 4, simulator 408 may be configured to obtain a simulation scenario comprising a plurality of simulation steps, according to an embodiment as discussed in detail above.

Flowchart 500 of FIG. 5 continues at step 506. In step 506, the simulation scenario is executed against the simulation model to produce a simulation result. For example, and with continued reference to FIG. 4, simulator 408 may be configured to execute the scenario against simulation model 416 of graph database 406 to produce simulation result 422 as also discussed in detail above.

Embodiments analyze the simulation result to determine at least one computing system modification at step 508 of flowchart 500 of FIG. 5. For example, and with continued reference to FIG. 4, computing system analyzer 410 may be configured to analyze simulation result 422 to determine at least one modification 432 to computing system 402 per the detailed discussion above.

Flowchart 500 of FIG. 5 concludes at step 510. In step 510, the computing system is modified according to the determined at least one system modification. For example, and as discussed in detail above, embodiments may be configured to modify computing system 402 according to modification 432 determined by computing system analyzer 410.

Embodiments of computing system simulation and testing environment 400 may likewise perform field exercises and/ or tests of, for example, computing system 402 in various ways. For example, FIG. 6 depicts a flowchart 600 of executing simulation scenarios and field exercises against a computing system simulation model (e.g. simulation model 416 of FIG. 4), and a computing system, respectively, according to an embodiment. In an embodiment, component mapper 404, simulator 408 (in conjunction with simulation model 416 of graph database 406), computing system analyzer 410 and computing system test component 412 may perform flowchart 600. FIG. 6 is described with continued reference to FIG. 4. However, other structural and operational embodiments will be apparent to persons skilled in the relevant art(s) based on the following discussion regarding flowchart 600 and environment 400 of FIG. 4.

Flowchart 600 of FIG. 6 begins at step 602. In step 602, one or more properties of each of a plurality of computing system components included in a computing system is mapped to one or more properties of a corresponding plurality of virtual components included in a simulation model. For example, and with continued reference to FIG. 4, component mapper 404 may be configured to map properties of, for example, computing components 414 of computing system 402 onto virtual components 418 of simulation model 416 as discussed in detail herein above.

Flowchart 600 continues at step 604. In step 604, a simulation scenario against the simulation model is executed to produce a simulation result, the simulation scenario comprising a plurality of simulation steps, each step related to a state of a virtual component included in the simulation model. For example, and with continued reference to FIG. 4, simulator 408 may be configured to execute a simulation scenario against simulation model 416 to obtain simulation result 422, and wherein simulation model 416 comprises a plurality of simulation steps, each related to a state of a virtual component included in the simulation model, and as discussed extensively above.

In step 606, a state change is applied to at least one of the plurality of computing system components, the state change corresponding to a simulation step of the simulation scenario. For example, and as discussed above, computing system test component 412 may be configured in embodiments to perform a state change to at least one of computing system components 414.

In step 608, the state of at least one of the plurality of computing system components is monitored to determine a test result. For example, and with continued reference to FIG. 4 and its corresponding discussion herein above, computing system test component 412 may be configured to monitor computing system components 414 of computing system 402 to determine test result 420.

Flowchart 600 of FIG. 6 concludes at step 610. In step 610, at least one modification to the computing system is determined based at least in part on the simulation result or the test result. For example, and with continued reference to FIG. 4 and its corresponding discussion herein above, computing system analyzer 410 may be configured in some embodiments to analyze test result 420 to determine at least one modification 432 to make to computing system 402.

III. Example Computer System Implementation

Component mapper 104, simulator 108, computing system analyzer 110, computing system test component 112, graph database 106, and flowcharts 500 and/or 600 may be implemented in hardware, or hardware combined with software and/or firmware. For example, component mapper 104, simulator 108, computing system analyzer 110, computing system test component 112, graph database 106, and flowcharts 500 and/or 600 may be implemented as computer program code/instructions configured to be executed in one or more processors and stored in a computer readable storage medium. Alternatively, component mapper 104, simulator 108, computing system analyzer 110, computing system test component 112, graph database 106, and flowcharts 500 and/or 600 may be implemented as hardware logic/electrical circuitry.

For instance, in an embodiment, one or more, in any combination, of component mapper 104, simulator 108, computing system analyzer 110, computing system test component 112, graph database 106, and flowcharts 500 and/or 600 may be implemented together in a SoC. The SoC may include an integrated circuit chip that includes one or more of a processor (e.g., a central processing unit (CPU), microcontroller, microprocessor, digital signal processor (DSP), etc.), memory, one or more communication interfaces, and/or further circuits, and may optionally execute received program code and/or include embedded firmware to perform functions.

Figure 7:
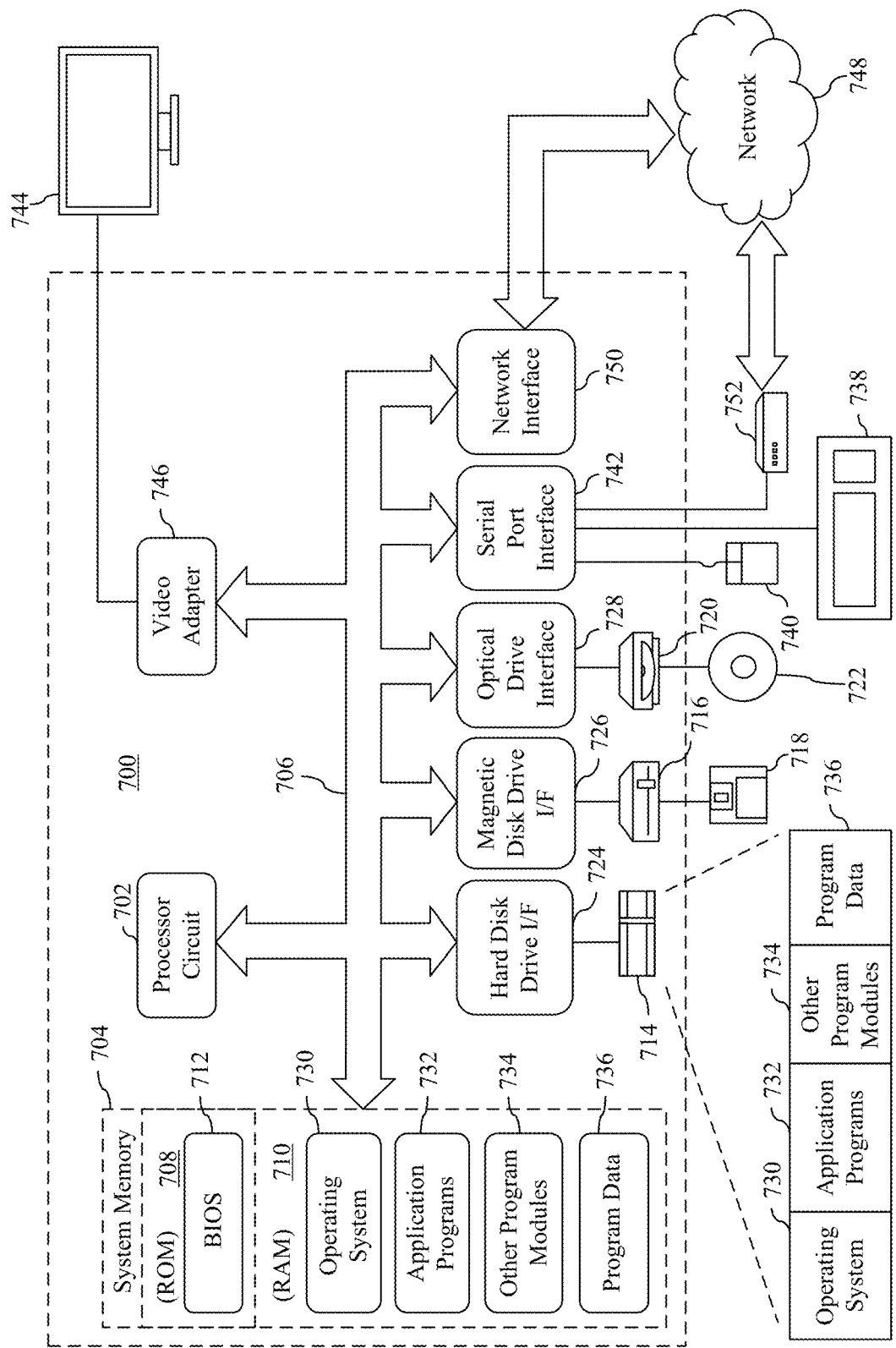
FIG. 7 is a block diagram of an example processor-based computer system that may be used to implement various embodiments.

FIG. 7 depicts an exemplary implementation of a computing device 700 in which embodiments may be implemented. For example, component mapper 104, simulator 108, computing system analyzer 110, computing system test component 112, graph database 106, and any of computing system components 114 may each be implemented in one or more computing devices similar to computing device 700 in stationary or mobile computer embodiments, including one or more features of computing device 700 and/or alternative features. The description of computing device 700 provided herein is provided for purposes of illustration, and is not intended to be limiting. Embodiments may be implemented in further types of computer systems, as would be known to persons skilled in the relevant art(s).

As shown in FIG. 7, computing device 700 includes one or more processors, referred to as processor circuit 702, a system memory 704, and a bus 706 that couples various system components including system memory 704 to processor circuit 702. Processor circuit 702 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor circuit 702 may execute program code stored in a computer readable medium, such as program code of operating system 730, application programs 732, other programs 734, etc. Bus 706 represents one or more of any of several types of bus structures, including a memory bus or memory controller, a peripheral bus, an accelerated graphics port, and a processor or local bus using any of a variety of bus architectures. System memory 704 includes read only memory (ROM) 708 and random access memory (RAM) 710. A basic input/output system 712 (BIOS) is stored in ROM 708.

Computing device 700 also has one or more of the following drives: a hard disk drive 714 for reading from and writing to a hard disk, a magnetic disk drive 716 for reading from or writing to a removable magnetic disk 718, and an optical disk drive 720 for reading from or writing to a removable optical disk 722 such as a CD ROM, DVD ROM, or other optical media. Hard disk drive 714, magnetic disk drive 716, and optical disk drive 720 are connected to bus 706 by a hard disk drive interface 724, a magnetic disk drive interface 726, and an optical drive interface 728, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMs, ROMs, and other hardware storage media.

A number of program modules may be stored on the hard disk, magnetic disk, optical disk, ROM, or RAM. These programs include operating system 730, one or more application programs 732, other programs 734, and program data 736. Application programs 732 or other programs 734 may include, for example, computer program logic (e.g., computer program code or instructions) for implementing Time series anomaly ranking system 122, time series normalizes 202, time series ranker 204, and flowcharts 200, 300, 500, 600 and/or 700 (including any suitable step of flowcharts 200, 300, 500, 600 and/or 700), and/or further embodiments described herein.

A user may enter commands and information into the computing device 700 through input devices such as keyboard 738 and pointing device 740. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor circuit 702 through a serial port interface 742 that is coupled to bus 706, but may be connected by other interfaces, such as a parallel port, game port, or a universal serial bus (USB).

A display screen 744 is also connected to bus 706 via an interface, such as a video adapter 746. Display screen 744 may be external to, or incorporated in computing device 700. Display screen 744 may display information, as well as being a user interface for receiving user commands and/or other information (e.g., by touch, finger gestures, virtual keyboard, etc.). In addition to display screen 744, computing device 700 may include other peripheral output devices (not shown) such as speakers and printers.

Computing device 700 is connected to a network 748 (e.g., the Internet) through an adaptor or network interface 750, a modem 752, or other means for establishing communications over the network. Modem 752, which may be internal or external, may be connected to bus 706 via serial port interface 742, as shown in FIG. 7, or may be connected to bus 706 using another interface type, including a parallel interface.

As used herein, the terms "computer program medium," "computer-readable medium," and "computer-readable storage medium" are used to refer to physical hardware media such as the hard disk associated with hard disk drive 714, removable magnetic disk 718, removable optical disk 722, other physical hardware media such as RAMs, ROMs, flash memory cards, digital video disks, zip disks, MEMs, nanotechnology-based storage devices, and further types of physical/tangible hardware storage media. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media that are separate and non-overlapping with embodiments directed to computer-readable storage media.

As noted above, computer programs and modules (including application programs 732 and other programs 734) may be stored on the hard disk, magnetic disk, optical disk, ROM, RAM, or other hardware storage medium. Such computer programs may also be received via network interface 750, serial port interface 742, or any other interface type. Such computer programs, when executed or loaded by an application, enable computing device 700 to implement features of embodiments described herein. Accordingly, such computer programs represent controllers of the computing device 700.

Embodiments are also directed to computer program products comprising computer code or instructions stored on any computer-readable medium. Such computer program products include hard disk drives, optical disk drives, memory device packages, portable memory sticks, memory cards, and other types of physical storage hardware.

IV. Additional Example Embodiments

A method is described herein. The method includes: providing one or more computer-readable memory devices storing a simulation model of a computing system that includes a plurality of computing system components, the computing system components including a plurality of interconnected computing devices, the simulation model including virtual components comprising types and relationships between types; obtaining a simulation scenario comprising a plurality of simulation steps, each step related to a state of a virtual component included in the simulation model; executing the simulation scenario against the simulation model to produce a simulation result; analyzing the simulation result to determine at least one computing system modification; modifying the computing system according to the determined at least one computing system modification.

In one embodiment of the foregoing method, the computing system comprises a cloud computing services platform.

In one embodiment of the foregoing method, the simulation model is based at least in part on an instance of a graph database wherein the types comprise graph vertices, and the relationships comprise graph edges.

In one embodiment of the foregoing method, the computing system components comprise one or more: computer services, computer servers, rack of computer servers, datacenters including racks of computer servers, client computing devices, virtual machines, network infrastructure components, storage components, software components, electrical system components, building mechanical components, heating, venting and air conditioning components, lighting components, security system components, or system monitoring components.

In another embodiment of the foregoing method, the simulation scenario comprises simulation steps to simulate at least one of the following: computing system failure mode scenarios; computing system inventory management scenarios; computing system security scenarios; or computing system component failure scenarios.

In one embodiment of the foregoing method, modifying the computing system according to the determined at least one computing system modification comprises at least one of the following: physically modifying or replacing at least one computing system component; removing at least one redundant computing system component; adding additional computing system components; reconfiguring operating settings of at least one computing system component; modifying inventory procedures of the computing system; or configuring the computing system to automatically generate a notification in response to a detected computing system state.

In one embodiment of the foregoing method, the computing system components further comprise at least one of: a database or a database table.

A system is described herein. In one embodiment, the system comprises: one or more processor circuits; one or more memory devices connected to the one or more processor circuits, the one or more memory devices storing: a graph database that comprises a simulation model of a computing system, the computing system comprising a plurality of computing system components, the computing system components including a plurality of interconnected computing devices, the simulation model including virtual components comprising graph vertices and interconnecting graph edges; and computer program logic for execution by the one or more processor circuits, the computer program logic comprising: a component mapper configured to map one or more properties of each of the plurality of computing system components to one or more properties of a corresponding plurality of virtual components included in the simulation model; a simulator configured to execute a simulation scenario against the simulation model to produce a simulation result, the simulation scenario comprising a plurality of simulation steps, each step related to a state of a virtual component included in the simulation model; a computing system test component configured to: apply a state change to at least one of the plurality of computing system components, the state change corresponding to a simulation step of the simulation scenario; monitor a state of at least one of the plurality of computing system components to determine a test result; and a computing system analyzer configured to determine at least one modification to the computing system based at least in part on the simulation result or the test result.

In one embodiment of the foregoing system, the computing system comprises a cloud computing services platform.

In one embodiment of the foregoing system, the computing system components comprise one or more: computer services, computer servers, rack of computer servers, datacenters including racks of computer servers, client computing devices, virtual machines, network infrastructure components, storage components, electrical system components, building mechanical components, heating, venting and air conditioning components, lighting components, security system components, or system monitoring components.

In one embodiment of the foregoing system, the simulation scenario comprises steps to simulate at least one of the following: computing system failure mode scenarios computing system inventory management scenarios; computing system data flow scenarios; or computing system component failure scenarios.

In one embodiment of the foregoing system, the at least one modification to the computing system comprises: a physical modification or replacement of at least one computing system component; a removal of at least one redundant computing system component; an addition of more computing system components; a reconfiguration of operating settings of at least one computing system component; a modification to inventory procedures of the computing system; or a modification causing the computing system to automatically generate a notification in response to a detected state of at least one computing system component.

In one embodiment of the foregoing system, the computing system components further comprise at least one of: a database or a database table.

A computer-readable memory device having computer program logic recorded thereon that when executed by at least one processor of a computing device causes the at least one processor to perform operations is described herein. In one embodiment of the computer program product, the operations comprise: accessing a simulation model of a computing system comprising a plurality of computing system components, the computing system components including a plurality of interconnected computing devices, the simulation model including virtual components comprising types and relationships between types; obtaining a simulation scenario comprising a plurality of simulation steps, each step related to a state of a virtual component included in the simulation model; executing the simulation scenario against the simulation model to produce a simulation result; analyzing the simulation result to determine at least one computing system modification; modifying the computing system according to the determined at least one computing system modification.

In one embodiment of the foregoing computer-readable memory device, the computing system comprises a cloud computing services platform.

In one embodiment of the foregoing computer-readable memory device, the simulation model is based at least in part on an instance of a graph database wherein the types comprise graph vertices, and relationships comprise graph edges.

In one embodiment of the foregoing computer-readable memory device, the computing system components comprise one or more: computer services, computer servers, rack of computer servers, datacenters including racks of computer servers, client computing devices, virtual machines, network infrastructure components, storage components, electrical system components, building mechanical components, heating, ventilation and air conditioning components, lighting components, security system components, or system monitoring components.

In one embodiment of the foregoing computer-readable memory device, the simulation scenario comprises simulation steps to simulate at least one of the following: computing system failure mode scenarios; computing system inventory management scenarios; computing system data flow scenarios; or computing system component failure scenarios.

In one embodiment of the foregoing computer-readable memory device, modifying the computing system according to the determined at least one computing system modification comprises at least one of the following: physically modifying or replacing at least one computing system component; removing at least one redundant computing system component; adding additional computing system components; reconfiguring operating settings of at least one computing system component; modifying computing system inventory procedures; configuring the computing system to automatically generate a notification in response to a detected system state.

In one embodiment of the foregoing computer-readable memory device, the computing system components further comprise at least one of: a database or a database table.

V. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A computer-implemented method, comprising:
providing one or more computer-readable memory devices storing a simulation model of a physical computing system that includes a plurality of computing system components, the computing system components comprising hardware assets of the computing system and including a plurality of interconnected computing devices, the simulation model including virtual components and comprising graph nodes and interconnecting graph edges, each graph node representing one of the plurality of computing system components and each graph edge representing a relationship between graph nodes connected by the edge;
obtaining a simulation scenario comprising a plurality of simulation steps, each step related to a state of a virtual component included in the simulation model;
executing the simulation scenario against the simulation model to produce a simulation result;
applying a state change to at least one of the plurality of computing system components, the state change corresponding to a simulation step of the simulation scenario;
monitoring a state of at least one of the plurality of computing system components to determine a test result; and
determining at least one modification to the computing system based at least in part on the simulation result or the test result.

2. The computer-implemented method of claim 1, wherein the computing system comprises a cloud computing services platform.

3. The computer-implemented method of claim 1, wherein the simulation model is based at least in part on an instance of a graph database.

4. The computer-implemented method of claim 1, wherein the computing system components comprise one or more: computer servers, rack of computer servers, datacenters including racks of computer servers, client computing devices, network infrastructure components, storage components, software components, electrical system components, building mechanical components, heating, venting and air conditioning components, lighting components, security system components, or system monitoring components.

5. The computer-implemented method of claim 1, wherein the simulation scenario comprises simulation steps to simulate at least one of the following:
computing system failure mode scenarios;
computing system inventory management scenarios;
computing system security scenarios; or
computing system component failure scenarios.

6. The computer-implemented method of claim 1, wherein the at least one modification to the computing system comprises at least one of the following:
a physical modification or replacement of at least one computing system component;
a removal of at least one redundant computing system component;
an addition of more computing system components;
a reconfiguration of operating settings of at least one computing system component;
a modification to inventory procedures of the computing system; or
a modification causing the computing system to automatically generate a notification in response to a detected computing system state.

7. A system, comprising:
one or more processor circuits;
one or more memory devices connected to the one or more processor circuits, the one or more memory devices storing:
a graph database that comprises a simulation model of a physical computing system, the computing system comprising a plurality of computing system components, the computing system components comprising hardware assets of the computing system and including a plurality of interconnected computing devices, the simulation model including virtual components and comprising graph nodes and interconnecting graph edges, each graph node representing one of the plurality of computing system components and each graph edge representing a relationship between graph nodes connected by the edge; and
computer program logic for execution by the one or more processor circuits, the computer program logic comprising:
a component mapper configured to map one or more properties of each of the plurality of computing system components to one or more properties of a corresponding plurality of virtual components included in the simulation model;
a simulator configured to execute a simulation scenario against the simulation model to produce a simulation result, the simulation scenario comprising a plurality of simulation steps, each step related to a state of a virtual component included in the simulation model;
a computing system test component configured to:
apply a state change to at least one of the plurality of computing system components, the state change corresponding to a simulation step of the simulation scenario; and
monitor a state of at least one of the plurality of computing system components to determine a test result; and
a computing system analyzer configured to determine at least one modification to the computing system based at least in part on the simulation result or the test result.

8. The system of claim 7, wherein the computing system comprises a cloud computing services platform.

9. The system of claim 7, wherein the computing system components comprise one or more: computer servers, rack of computer servers, datacenters including racks of computer servers, client computing devices, network infrastructure components, storage components, electrical system components, building mechanical components, heating, venting and air conditioning components, lighting components, security system components, or system monitoring components.

10. The system of claim 7, wherein the simulation scenario comprises steps to simulate at least one of the following:

computing system failure mode scenarios
computing system inventory management scenarios;
computing system data flow scenarios; or
computing system component failure scenarios.

11. The system of claim 7, wherein the at least one modification to the computing system comprises:
- a physical modification or replacement of at least one computing system component;
- a removal of at least one redundant computing system component;
- an addition of more computing system components;
- a reconfiguration of operating settings of at least one computing system component;
- a modification to inventory procedures of the computing system; or
- a modification causing the computing system to automatically generate a notification in response to a detected state of at least one computing system component.

12. A computer program product comprising a computer-readable memory device having computer program logic recorded thereon that when executed by at least one processor of a computing device causes the at least one processor to perform operations, the operations comprising:
- accessing a simulation model of a physical computing system comprising a plurality of computing system components, the computing system components comprising hardware assets of the computing system and including a plurality of interconnected computing devices, the simulation model including virtual components and comprising graph nodes and interconnecting graph edges, each graph node representing one of the plurality of computing system components and each graph edge representing a relationship between graph nodes connected by the edge;
- obtaining a simulation scenario comprising a plurality of simulation steps, each step related to a state of a virtual component included in the simulation model;
- executing the simulation scenario against the simulation model to produce a simulation result;
- applying a state change to at least one of the plurality of computing system components, the state change corresponding to a simulation step of the simulation scenario;
- monitoring a state of at least one of the plurality of computing system components to determine a test result; and
- determining at least one modification to the computing system based at least in part on the simulation result or the test result.

13. The computer program product of claim 12, wherein the computing system comprises a cloud computing services platform.

14. The computer program product of claim 12, wherein the simulation model is based at least in part on an instance of a graph database.

15. The computer program product of claim 12, wherein the computing system components comprise one or more: computer servers, rack of computer servers, datacenters including racks of computer servers, client computing devices, network infrastructure components, storage components, electrical system components, building mechanical components, heating, ventilation and air conditioning components, lighting components, security system components, or system monitoring components.

16. The computer program product of claim 12, wherein the simulation scenario comprises simulation steps to simulate at least one of the following:
- computing system failure mode scenarios;
- computing system inventory management scenarios;
- computing system data flow scenarios; or
- computing system component failure scenarios.

17. The computer program product of claim 12, wherein the at least one modification to the computing system comprises at least one of the following:
- a physical modification or replacement of at least one computing system component;
- a removal of at least one redundant computing system component;
- an addition of more computing system components;
- a reconfiguration of operating settings of at least one computing system component;
- a modification to computing system inventory procedures;
- a modification causing the computing system to automatically generate a notification in response to a detected system state.

18. The computer-implemented method of claim 1, wherein the applying the state change to at least one of the plurality of computing system components comprises changing a physical or operating state of at least one of the hardware assets of the computing system.

19. The system of claim 7, wherein the computing system test component is configured to apply a state change to at least one of the plurality of computing system components by changing a physical or operating state of at least one of the hardware assets of the computing system.

20. The computer program product of claim 12, wherein the applying the state change to at least one of the plurality of computing system components comprises changing a physical or operating state of at least one of the hardware assets of the computing system.

* * * * *